(12) United States Patent
Chae

(10) Patent No.: US 7,486,125 B2
(45) Date of Patent: Feb. 3, 2009

(54) DELAY CELLS AND DELAY LINE CIRCUITS HAVING THE SAME

(75) Inventor: Kwan-Yeob Chae, Seoul (KR)

(73) Assignee: Samsung Electronics Co., Ltd., Suwon-Si (KR)

(*) Notice: Subject to any disclaimer, the term of this patent is extended or adjusted under 35 U.S.C. 154(b) by 37 days.

(21) Appl. No.: 11/484,792

(22) Filed: Jul. 11, 2006

(65) Prior Publication Data

US 2007/0132497 A1    Jun. 14, 2007

(30) Foreign Application Priority Data

Dec. 12, 2005    (KR) .................. 10-2005-0121498

(51) Int. Cl.
*H03H 11/26* (2006.01)
(52) U.S. Cl. .................. 327/285; 327/272; 327/278; 327/283
(58) Field of Classification Search .................. None
See application file for complete search history.

(56) References Cited

U.S. PATENT DOCUMENTS

| | | | | |
|---|---|---|---|---|
| 5,023,891 A | * | 6/1991 | Johnson, III | 375/333 |
| 6,369,322 B1 | * | 4/2002 | Gretz | 174/50 |
| 6,774,693 B2 | * | 8/2004 | Carr | 327/276 |
| 7,061,293 B2 | * | 6/2006 | Fukushima | 327/291 |
| 7,135,906 B2 | * | 11/2006 | Takai et al. | 327/263 |
| 7,180,326 B2 | * | 2/2007 | Komyo | 326/27 |
| 7,230,498 B2 | * | 6/2007 | Osvaldella | 331/57 |
| 7,394,300 B2 | * | 7/2008 | Chae | 327/261 |
| 7,417,478 B2 | * | 8/2008 | Kim et al. | 327/158 |
| 2007/0008023 A1 | * | 1/2007 | Wang | 327/276 |

* cited by examiner

*Primary Examiner*—An T Luu
(74) *Attorney, Agent, or Firm*—F. Chau & Associates, LLC

(57) ABSTRACT

Delay line circuits include a plurality of delay cells connected in series. The delay cells respectively include a first to a third logic gate. The first logic gate, in response to a selection signal, generates a first signal based on an input signal. The second logic gate generates a second signal based on the input signal in response to the selection signal. The third logic gate generates a third signal based on either a return signal or an output signal of the second logic gate.

17 Claims, 7 Drawing Sheets

US 7,486,125 B2

DELAY CELLS AND DELAY LINE CIRCUITS HAVING THE SAME

CROSS-REFERENCE TO RELATED PATENT APPLICATION

This application claims priority to Korean Patent Application No. 10-2005-0121498, filed on Dec. 12, 2005, the contents of which are herein incorporated by reference in its entirety.

BACKGROUND OF THE INVENTION

1. Technical Field

The present disclosure relates to electronic circuits and, more particularly, to delay cells capable of improving characteristics of an output signal and delay line circuits having the delay cells.

2. Discussion of Related Art

A delay line circuit introduces a predetermined delay into the transmission of a signal. A delay line circuit generally includes a plurality of delay cells connected in series. A delay line circuit is widely used as a delay-locked loop circuit for generating clock signals synchronized to a reference clock signal. A typical delay-locked loop circuit uses a phase comparator to compare the phase of the reference clock signal with that of the delayed clock signal, and feeds back the comparison result to a delay controller that varies the delay of the delayed clock signal.

FIG. 1 is a block diagram of a conventional delay line. Referring to FIG. 1, the delay line includes a plurality of delay cells 10 connected in series and having the same operation. The delay line is controlled by a control signal SEL[N−1:0] comprising N bits, where N is equal to the number of delay cells, of which N−1 bits are "0" bits and one-out-of-N bits is "1".

FIG. 2 is a circuit diagram of a delay cell of FIG. 1. Referring to FIG. 2, the delay cell 10 includes a buffer 21, a multiplexer 22, a plurality of terminals IN, PS, RT and OT for inputting and outputting data, and a control terminal SEL receiving a control signal input.

The data input to the IN terminal is transmitted to the PS terminal. The multiplexer 22 transmits data according to the data input to the SEL terminal. For example, when logic 0 is input to the SEL terminal, the data input to the RT terminal is transmitted to the OT terminal. When logic 1 is input to the SEL terminal, the data input to the IN terminal is transmitted to the OT terminal through the buffer 21.

The delay T1 is the time for transmitting the data from the IN terminal to the PS terminal, the delay T2 is the time for transmitting the data from the PS terminal to the OT terminal, and the delay T3 is the time for transmitting the data from the RT terminal and the OT terminal. When "0" is input to the SEL terminal, the step delay of the delay cell 10 becomes equal to the sum of the delays T1 and T3. When "1" is input to the SEL terminal and when T2 is the same as T3, the step delay of the delay cell 10 becomes equal to the sum of the delays T2 and T1.

In conventional delay line circuits, the improvement of the characteristics of the output signal often requires a complex design or results in undesirably high power consumption. On the other hand, the reduction of power consumption or circuit size often degrades the characteristics of the output signal. Therefore, the need exists for a delay cell for use in a delay line circuit to provide improved performance with reduced power consumption.

SUMMARY OF THE INVENTION

According to an exemplary embodiment of the present invention, a delay line circuit includes a plurality of delay cells connected in series, wherein each of the delay cells comprises: a first logic gate generating a first signal based on an input signal in response to a selection signal; a second logic gate generating a second signal based on an input signal in response to the selection signal; and a third logic gate generating a third signal based on either a return signal or an output signal of the second logic gate.

Each of the delay cells may further comprise a fourth logic gate inverting the output signal of the third logic gate in response to an enable signal.

According to an exemplary embodiment of the present invention, a first to an $N^{th}$ delay cell having a pass terminal of a $i^{th}$ delay cell that is connected to an input terminal of a $(i+1)^{th}$ delay cell, and having an output terminal of the $(i+1)^{th}$ delay cell that is connected to a return terminal of the $i^{th}$ delay cell, where i is an integer from 1 to N−1 and where N is integer greater than 2, wherein, each of the first to the $N^{th}$ delay cells comprises a gate, and wherein each of the $N^{th}$ delay cells transmits a signal based on the input signal to the pass terminal and transmits a signal based on the return signal to the output terminal when the selection signal is at a first logic level, and transmits a signal based on the input signal to the output terminal when the selection signal is at a second logic level.

The present invention will become readily apparent to those of ordinary skill in the art when descriptions of exemplary embodiments thereof are read with reference to the accompanying drawings.

DESCRIPTION OF EXEMPLARY EMBODIMENTS

Figure 1:
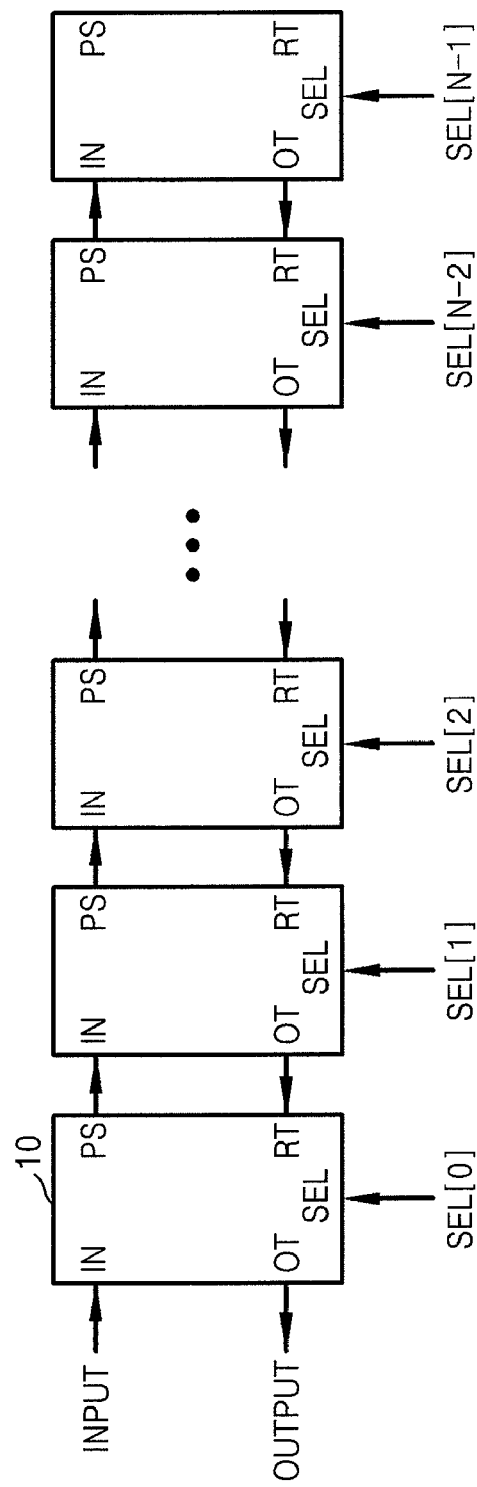
FIG. 1 is a block diagram of a conventional delay line.
Figure 2:
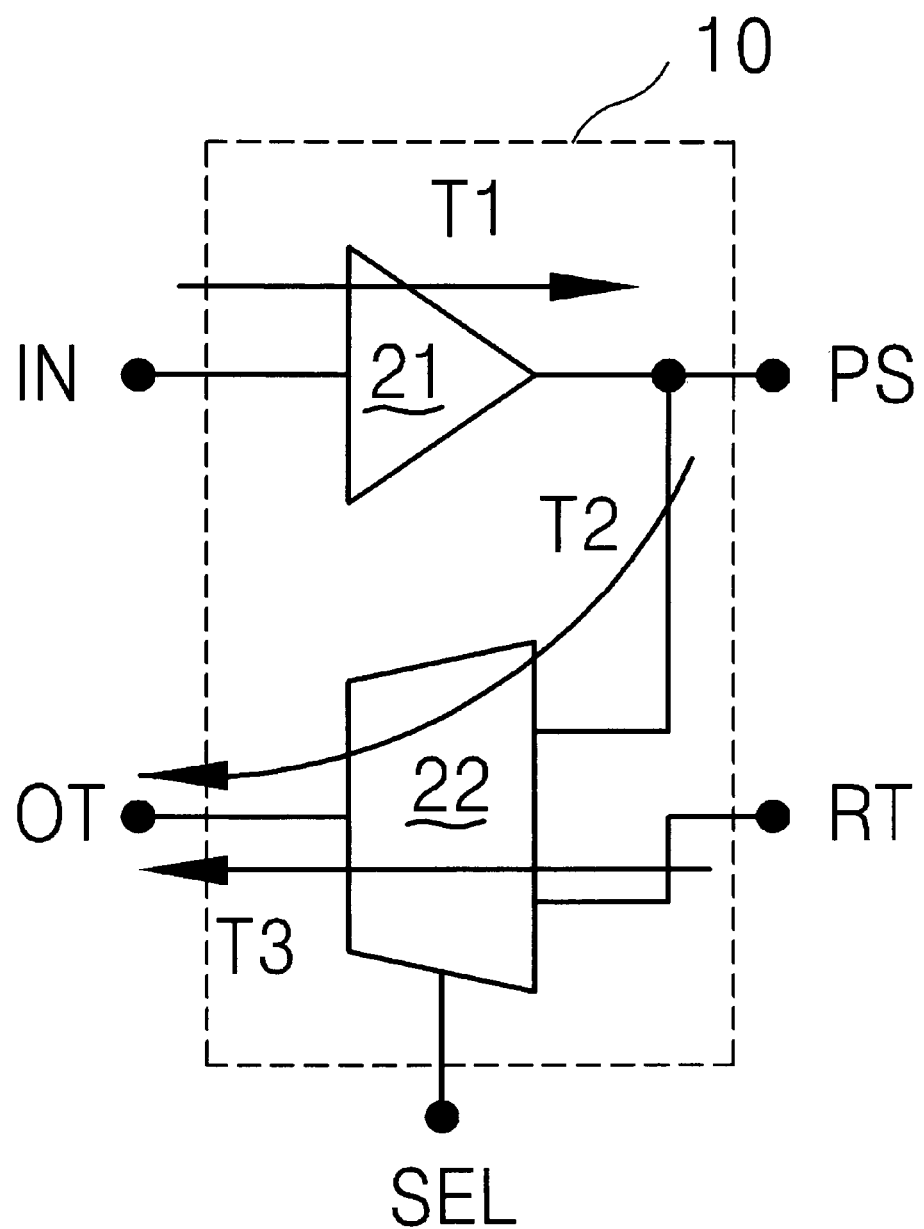
FIG. 2 is a circuit diagram of a delay cell of FIG. 1.

Hereinafter, exemplary embodiments of the present invention will be described in detail with reference to the accompanying drawings. Like reference numerals refer to similar or identical elements throughout the description of the figures.

Figure 3:
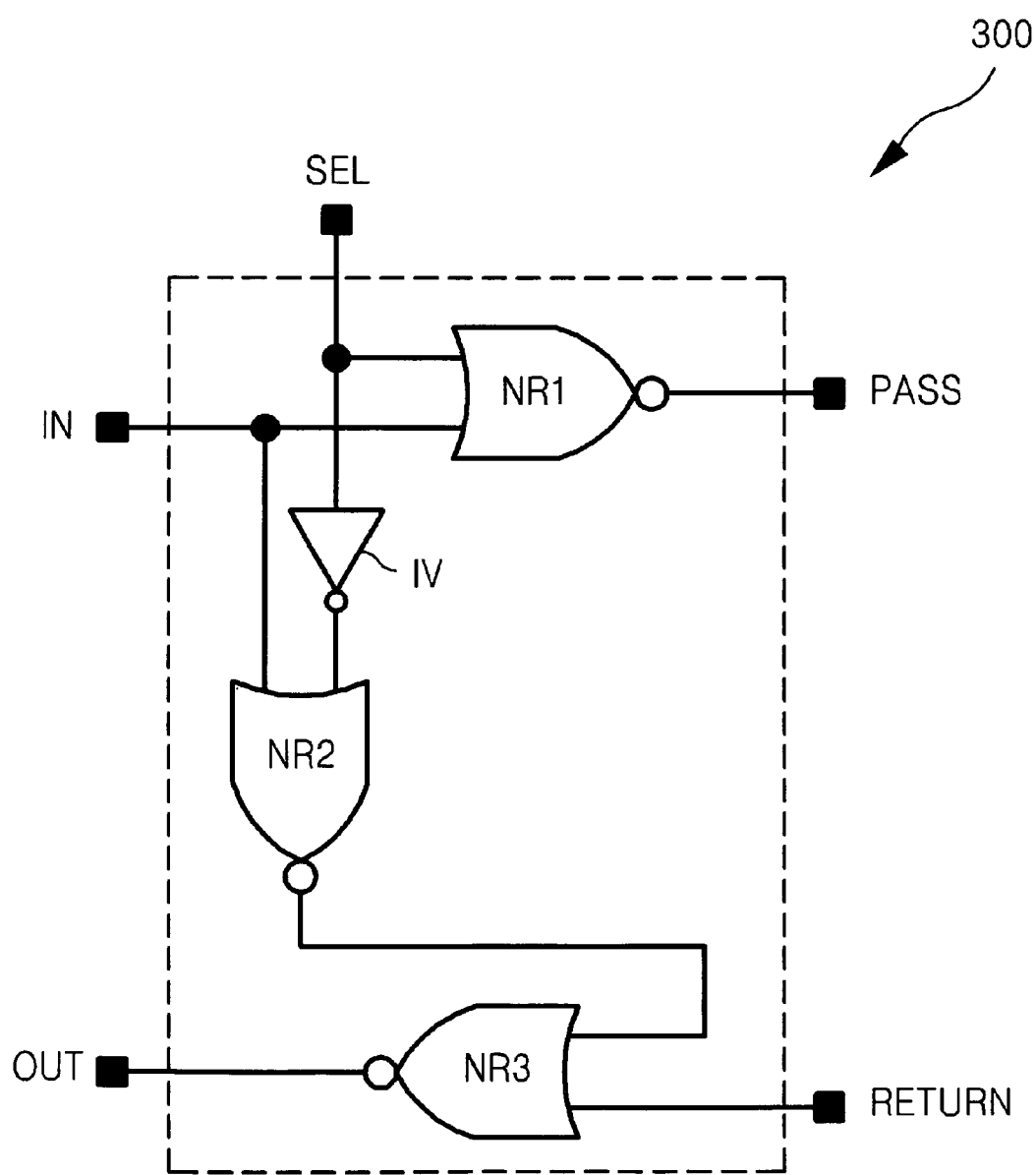
FIG. 3 is a circuit diagram of a delay cell according to an exemplary embodiment of the present invention.

FIG. 3 is a circuit diagram of a delay cell 30 according to an exemplary embodiment of the present invention. Referring to FIG. 3, the delay cell 30 includes logical NOR gates NR1, NR2, NR3, an inverter IV, terminals IN, PASS, RETURN, OUT for inputting and outputting the data, and a direction-selecting terminal SEL controlling a direction for transmitting the data. When a logic low level signal '0' is input to the direction-selecting terminal SEL, the data input to the input terminal IN is inverted through the NOR gate NR1 and transmitted to a pass terminal PASS. The data input to a return terminal RETURN is inverted through the NOR gate NR3 and transmitted to an output terminal OUT. When a logic high level signal '1' is input to the direction-selecting terminal SEL, the data input to the input terminal IN is transmitted to the output terminal OUT through NOR gates NR2, NR3. In an exemplary embodiment of the present invention, the pass terminal PASS is set to a predetermined value. For example, the pass terminal PASS may be set to 0.

The first NOR gate NR1 NORs the selection signal, which is the input signal to the direction selection terminal SEL, and the input signal, which is the input signal to the input terminal IN. The second NOR gate NR2 NORs a signal inverting the selection signal, and the input signal. The third NOR gate NR3 NORs the output signal from the second NOR gate NR2 and a return signal, which is a signal input to the return terminal RETURN.

Figure 4:
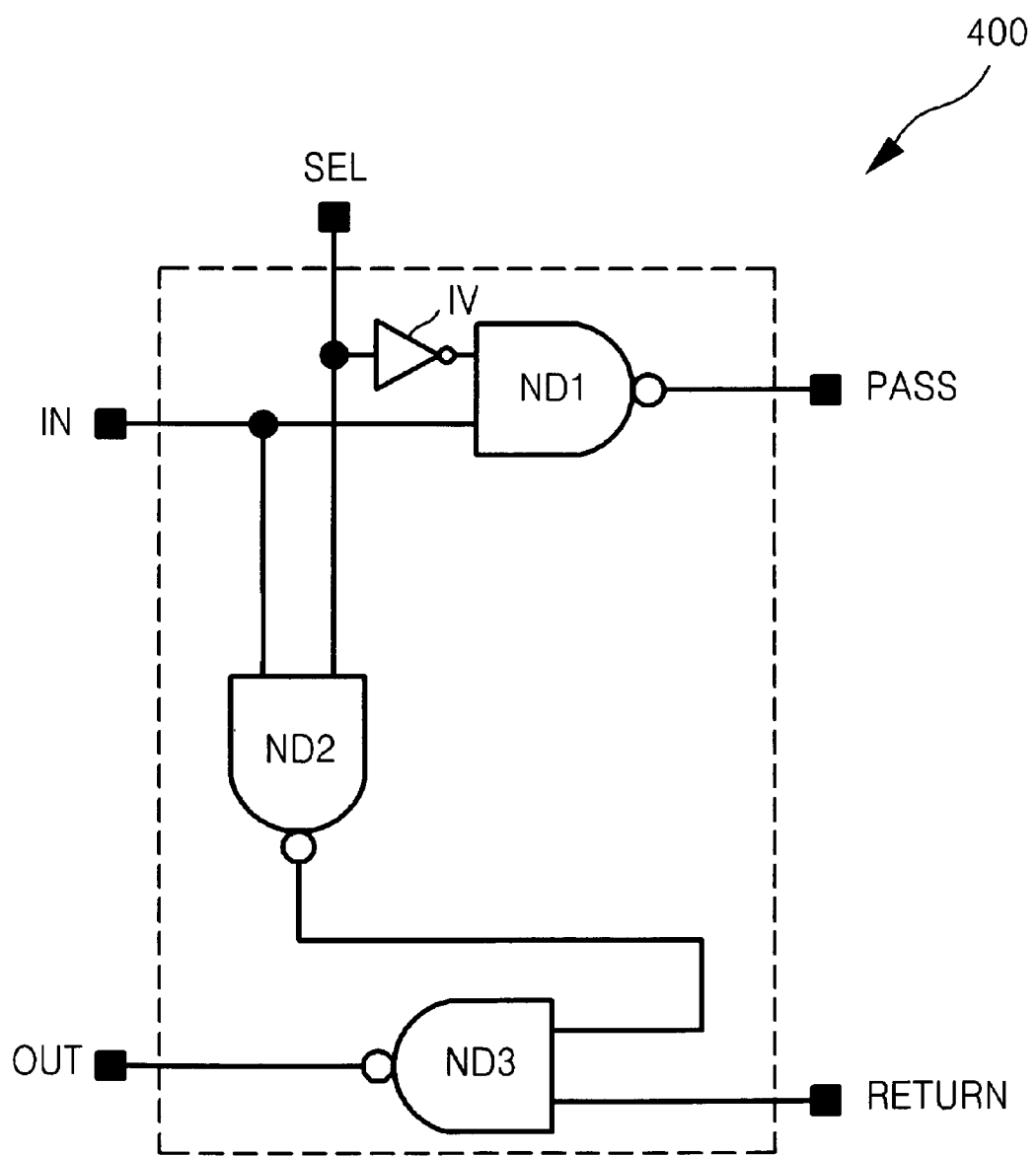
FIG. 4 is a circuit diagram of a delay cell according to an exemplary embodiment of the present invention.

FIG. 4 is a circuit diagram of the delay cell according to an exemplary embodiment of the present invention. Referring to FIG. 4, the delay cell 400 includes NAND gates ND1, ND2, ND3, and the inverter IV, the terminals IN, PASS, RETURN, OUT for inputting and outputting data, and the direction-selecting terminal SEL controlling the direction for transmitting data. When '0' is input to the direction-selecting terminal SEL, the data input to the input terminal IN is inverted through the NAND gate ND1 and transmitted to the pass terminal PASS, and the data input to the return terminal RETURN is inverted through the NAND gate ND3 and transmitted to the output terminal OUT. When '1' is input to the direction-selecting terminal SEL, the data input to the input terminal IN is transmitted to the output terminal OUT through the NAND gates ND2, ND3. In an exemplary embodiment of the present invention, the pass terminal PASS is set to a predetermined value. For example, the pass terminal PASS may be set to 1.

The first NAND gate ND1 NANDs a signal inverting the selection signal, which is the input signal of the direction-selecting terminal SEL, and the input signal, which is the input signal to the input terminal IN. The second NAND gate ND2 NANDs the selection signal and the input signal. The third NAND gate ND3 NANDs the output signal from the second NAND gate ND2 and the return signal, which is an input signal input to the return terminal RETURN.

Figure 5:
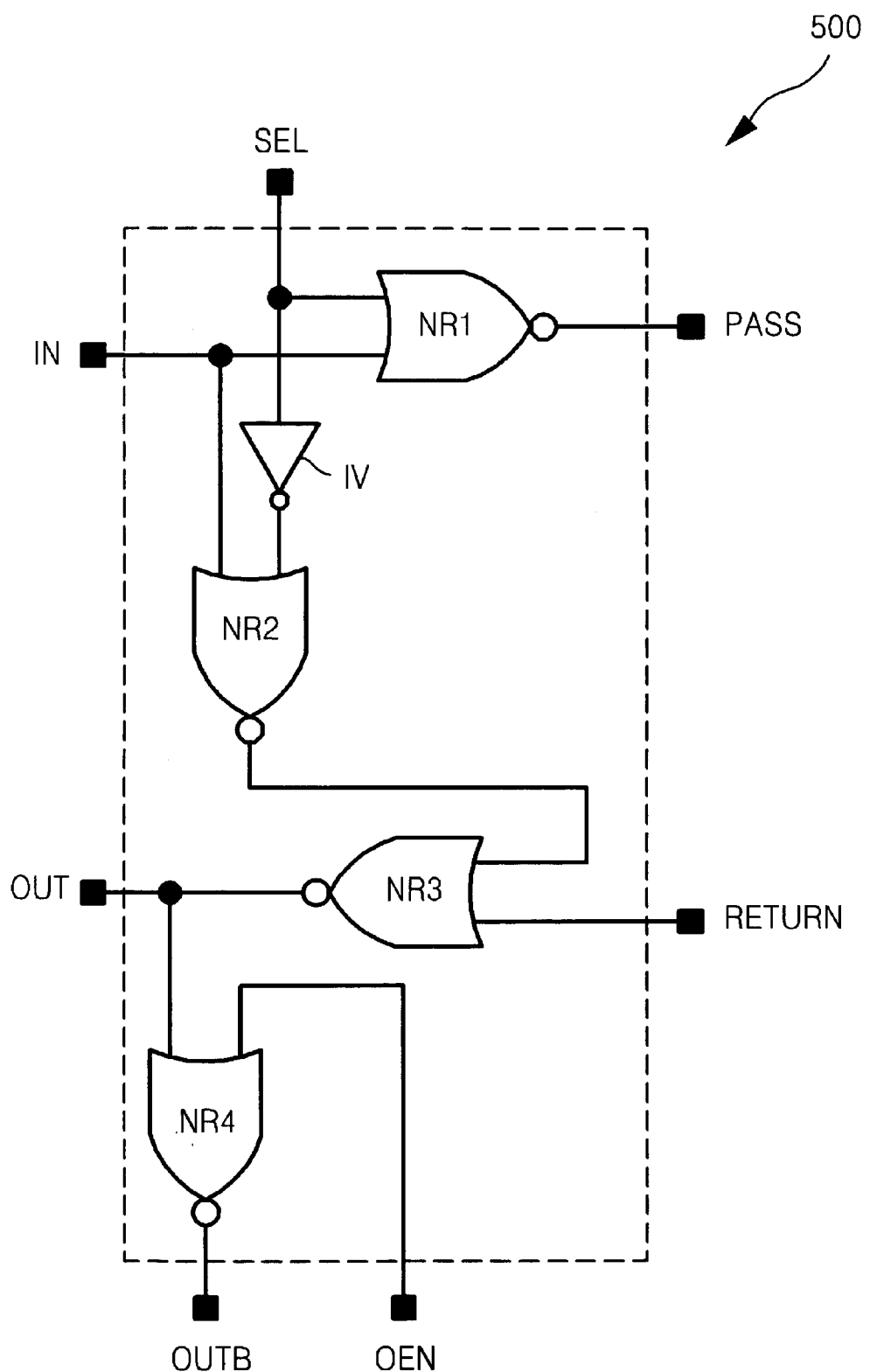
FIG. 5 is a circuit diagram of a delay cell according to an exemplary embodiment of the present invention.

FIG. 5 is a circuit diagram of the delay cell 500 according to an exemplary embodiment of the present invention. Referring to FIG. 5, the delay cell 500, as compared to the delay cell 300 shown in FIG. 3, further includes a NOR gate NR4, a inversion output terminal OUTB, and an enable terminal OEN. For example, NOR gate NR4 is a dummy gate equalizing the load condition when the delay cell 500 is connected in a plurality of series. When '0' is input to the enable terminal OEN, the inversion signal of the output signal (i.e., the output terminal OUT signal) of the NOR gate NR3 is output to the inversion output terminal OUTB. The NOR gate NR4 NORs the enable signal, which is an input signal to the enable terminal OEN, and an output signal from the third NOR gate NR3. When '0' is input to the enable terminal OEN, a signal having a different phase from that of the output terminal OUT signal may be additionally obtained through the inversion output terminal OUTB.

Figure 6:
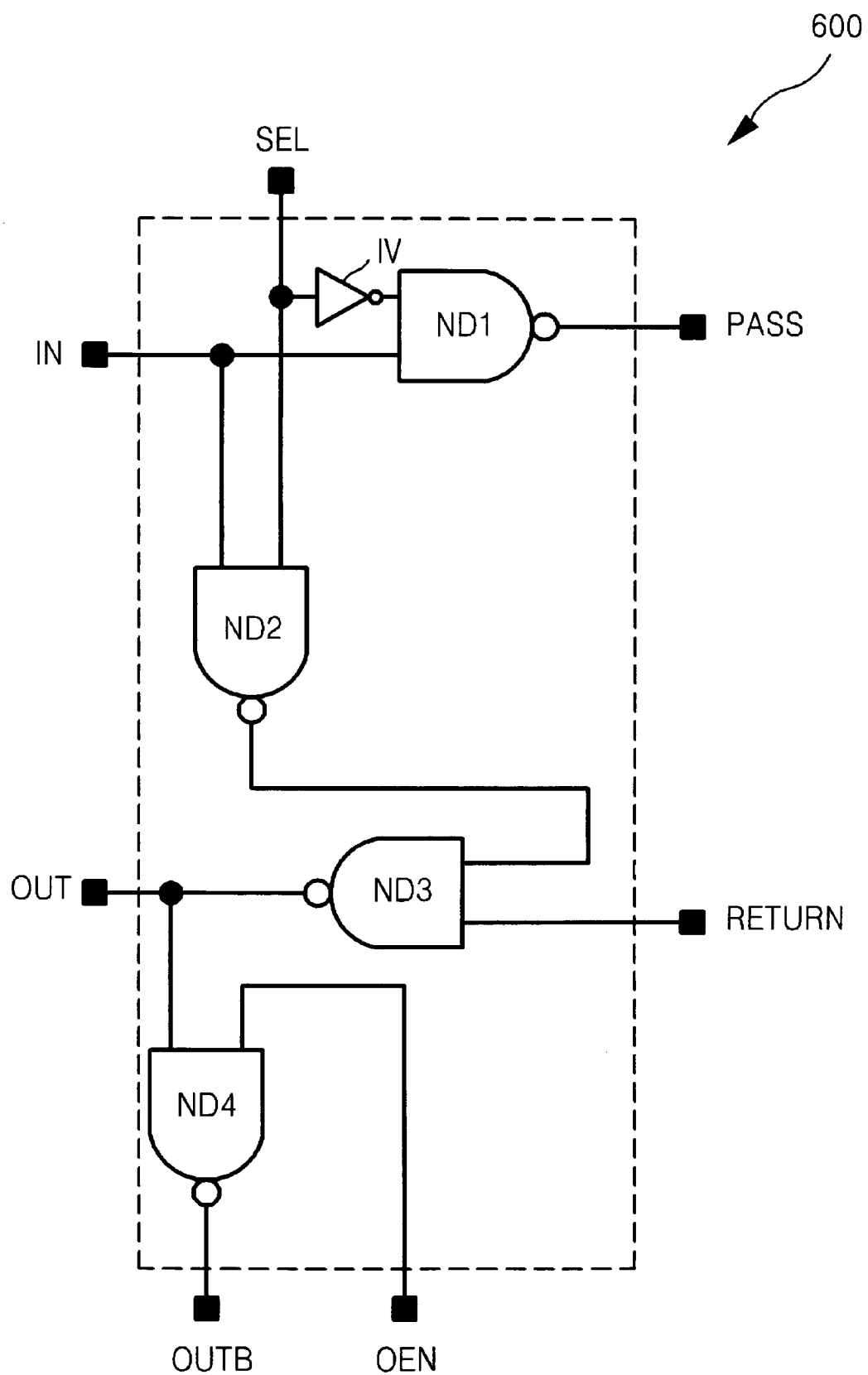
FIG. 6 is a circuit diagram of a delay cell according to an exemplary embodiment of the present invention.

FIG. 6 is a circuit diagram of the delay cell 600 according to an exemplary embodiment of the present invention. Referring to FIG. 6, the delay cell 600, as compared to the delay cell 400 of FIG. 4, further includes a NAND gate ND4; the inversion output terminal OUTB, and the enable terminal OEN. For example, NAND gate ND4 is a dummy gate equalizing the load condition when the delay cell 600 is connected in a plurality of series. When '1' is input to the enable terminal OEN, the inversion signal of the output signal (i.e., the output terminal signal) of the NAND gate ND3 is output to the inversion output terminal OUTB. The NAND gate ND4 NANDs and outputs the enable signal, which is an input signal to the enable terminal OEN, and the output signal of the third NAND gate ND3. Therefore, if '1' is input to the enable terminal OEN, the signal having a different phase from a signal of the output terminal OUT may be obtained through the inversion output terminal OUTB.

Figure 7:
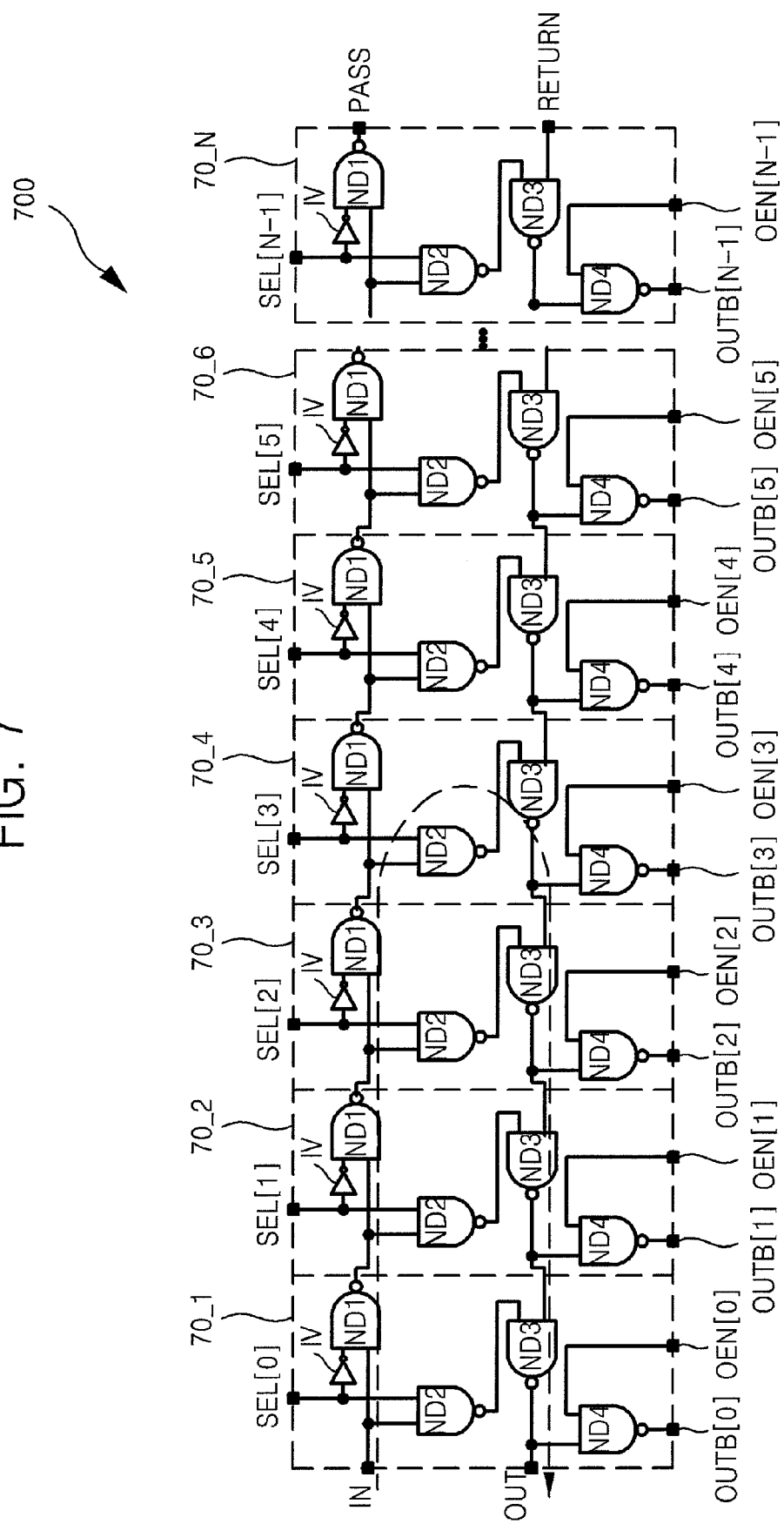
FIG. 7 is a circuit diagram of a delay line according to an exemplary embodiment of the present invention.

FIG. 7 is a circuit diagram of the delay line 700 according to an exemplary embodiment of the present invention. The delay line 700 is implemented by connecting N delay cells 70_1 to 70_N in series. For example, each of the delay cells 70_1 to 70_N has the same configuration as the delay cells 600 of FIG. 6.

Each of the delay cells 70_1 to 70_N transmits or returns the input data in response to the SEL[ ] input to the direction selection terminal. For the purposes of this disclosure, "transmission" means transmitting the signal that is input to the input terminal IN to the pass terminal PASS, and transmitting the signal that is input to the return terminal RETURN to the output terminal OUT. For the purposes of this disclosure, 'return' means to transmit the signal input to the input terminal IN to the output terminal OUT.

In this exemplary case, every SEL[N−1:3] is 1 and SEL[2:0] is 0. As illustrated by the dotted line in FIG. 7, the signal (hereinafter, "input signal"), which is input to the input terminal IN of the first delay cell 70_1, is output to the output terminal OUT of the first delay cell 70_1 through 8 NAND gates. Since a transmission of a signal occurs at the first to the third delay cells 70_1, 70_2, 70_3, and a return of the signal occurs at the fourth delay cell 70_4, the input signal that goes through the first to the third delay cells 70_1, 70_2, 70_3 is returned at the fourth delay cell 70_4, and the returned signal is output through the third to the first delay cells 70_3, 70_2, 70_1. The input signal, which is input to the input terminal IN of the first delay cell 70_1, is output to the output terminal OUT of the first delay cell 70_1 through the NAND gates ND1 of the first to the third delay cell 70_1, 70_2, 70_3, the NAND gates ND2, ND3 of the fourth delay cell, and the NAND gates ND3 of the third to the first delay cell.

In an exemplary embodiment of the present invention, delay cells 70_5 to 70_N after the fourth tap (the fourth delay cell, 70_4) output a set value of 1 or 0 to the pass terminal PASS. Therefore, no level transition occurs at an output signal of the pass terminal PASS.

In this exemplary case, every SEL[k−1:0] is 0 and every SEL[N−1:k] is 1. In such case, the input signal to the input terminal IN of the first delay cell 70_1 is output to the output terminal OUT of the first delay cell 70_1 through 2 k NAND gates. Here, the NAND gate ND1 and the NAND gate ND3 at each of the delay cells 70_1 to 70_N are equally driving two NAND gate loads. For example, the third delay cell 70_3, an output of the NAND gate ND1 of the third delay cell 70_3 is connected to the two NAND gates ND1, ND2 of the fourth delay cell 70_4, and an output of the NAND gate ND3 of the third delay cell 70_3 is connected to the NAND gate ND4 of the third delay cell 70_3 and the NAND gate ND3 of the second delay cell 70_2.

According to an exemplary embodiment of the present invention, the input signal is output through an even number of NAND gates, and the output signal maintains the duty cycle of the input signal. In an exemplary embodiment of the present invention, as a level transition does not occur in the delay cells after a $k^{th}$ delay cell, i.e., a $(k+1)^{th}$ to an $N^{th}$ delay cell, power consumption is minimized.

When a predetermined signal (for example, 1) is input to the enable terminal OEN of any delay cell, the delay signal may be obtained from the inversion output terminal OUTB of the delay cell. The delay cells, according to an exemplary embodiment of the present invention, may be used as a DLL phase detector. For example, the delay line may comprise the delay cells of FIG. 6 connected in series.

One of ordinary skill in the art can readily appreciate that the above described delay cell can be implemented using NAND gates, NOR gates, or gates that are logically equivalent. In an exemplary embodiment of the present invention, the input signal is output through an even number of gates, the output signal maintains the duty of the input signal, characteristics of the output signal may be improved, and the timing margin may be improved.

According to exemplary embodiments of the present invention, the characteristics of an output signal of the delay cell or the delay line circuit, such as for example, the duty characteristic may be improved and the power consumption may be decreased.

Although the exemplary embodiments of the present invention have been described in detail with reference to the accompanying drawings for the purpose of illustration, it is to be understood that the inventive processes and apparatus should not be construed as limited thereby. It will be readily apparent to those of reasonable skill in the art that various modifications to the foregoing exemplary embodiments can be made without departing from the scope of the invention as defined by the appended claims, with equivalents of the claims to be included therein.

What is claimed is:

1. A delay line circuit comprising:
a plurality of selection lines, each selection line receiving a respective one of a plurality of external selection signals; and
a plurality of delay cells connected in series, wherein each of the delay cells comprises:
a pass terminal, wherein the pass terminal of an ith delay cell is connected to an input terminal of a (i+1)th delay cell;
a first logic gate generating a first signal based on an input signal and an external selection signal received from a respective one of the selection lines, wherein the first signal is transmitted to the pass terminal;
a second logic gate generating a second signal based on the input signal and the external selection signal; and
a third logic gate generating a third signal based on a return signal and an output signal from the second logic gate.

2. The delay line circuit according to claim 1, wherein each of the delay cells further comprises a fourth logic gate inverting the output signal from the third logic gate in response to an enable signal.

3. The delay line circuit of claim 1, wherein when the external selection signal of a first logic level is applied to each selection line of a subset of the delay cells and the external selection signal of a second level is applied to each selection line of the remaining delays cells, the input signal passes through the subset of delay cells to an output terminal of the delay line circuit.

4. The delay line circuit of claim 3, wherein the input signal passes through the first logic gates of the subset, second logic gate of the last delay cell of the subset and third logic gates of all the delay cells of the subset.

5. A delay line circuit comprising:
a plurality of delay cells connected in series, wherein each of the delay cells comprises:
a first logic gate generating a first signal based on an input signal and a respective one of a plurality of external selection signals;
a second logic gate generating a second signal based on the input signal and the respective external selection signal;
a third logic gate generating a third signal based on a return signal and an output signal from the second logic gate; and
a fourth logic gate inverting the output signal from the third logic gate in response to an enable signal, wherein
the first, the second, the third, and the fourth logic gates are logical NAND gates, the first logic gate inverts and transmits the input signal to a pass terminal, and the second logic gate inverts and transmits the input signal to the third logic gate, and the third logic gate transmits one of the output signal of the second logic gate to the output terminal when the selection signal is at the first logic level or the return signal to the output terminal when the selection signal is at the second logic level.

6. The delay line circuit according to claim 5, wherein
the first logic gate NANDs an inversion signal of the selection signal and the input signal,
the second logic gate NANDs the selection signal and the input signal, the third logic gate NANDs the output signal of the second logic gate and the return signal, and
the fourth logic gate NANDs the enable signal and the output signal of the third logic gate.

7. A delay line circuit comprising:
a plurality of selection lines, each selection line receiving a respective one of a plurality of external selection signals; and
a first to an Nth delay cell having a pass terminal of an ith delay cell that is connected to the input terminal of a (i+1)th delay cell, and having an output terminal of the (i+1)th delay cell that is connected to a return terminal of the ith delay cell, where i is an integer from 1 to N-1 and where N is integer greater than 2,
wherein each of the first to the Nth delay cells comprises a gate, and wherein each of the first to the Nth delay cells transmits a first signal based on the input signal to the pass terminal and transmits a signal based on a return signal to the output terminal when an external selection signal received from a respective one of the selection lines is at a first logic level, and
transmits a second signal based on the input signal to the output terminal when the external selection signal is at a second logic level.

8. The delay line circuit according to claim 7, wherein each of the first to the Nth delay cells comprises:
a first logic part generating and transmitting a signal, which is based on the input signal, to the pass terminal in response to the selection signal;
a second logic part generating a signal based on the input signal in response to the selection signal;
a third logic part generating and transmitting a signal, which is based on either the return signal or the output signal of the second logic part, to the output terminal; and
a fourth logic part inverting and transmitting the output signal of the third logic part to the inversion output terminal in response to an enable signal.

9. The delay line circuit according to claim 8, wherein
the first logic part includes a first logic gate that NORs the selection signal and the input signal,
the second logic part includes a second logic gate that NORs the signal inverting the selection signal and the input signal, the third logic part includes a third logic gate that NORs the output signal of the second logic gate and the return signal, and the fourth logic part includes a fourth logic gate that NORs the enable signal and the output signal of the third logic gate.

10. The delay line circuit according to claim 8, wherein the first logic part includes the first logic gate that NANDs an inversion of the selection signal and the input signal, the second logic part includes the second logic gate that NANDs the selection signal and the input signal, the third logic part includes the third logic gate that NANDs the output signal of the second logic gate and the return signal, the fourth logic part includes the fourth logic gate that NANDs the enable signal and the output signal of the third logic gate.

11. The delay line circuit according to claim 8, wherein no level transition occurs at the output signal of the pass terminal of each of the first to the Nth delay cell when the selection signal is at the second logic level.

12. A plurality of delay cells comprising:

a first logic gate generating and transmitting a first signal from an input signal and a respective one of a plurality of external selection signals to a pass terminal, wherein the pass terminal of an ith delay cell is connected to an input terminal of a (i+1)th delay cell;

a second logic gate generating a second signal from the input signal and the respective external selection signal; and a third logic gate generating and transmitting one of a third signal from a return signal to an output terminal when the external selection signal is set to a first logic level or transmitting an output signal of the second logic gate to the output terminal when the external selection signal is set to a second logic level.

13. The delay cell according to claim 12 further comprising a fourth logic gate inverting and transmitting an output signal of the third logic gate to an inversion output terminal.

14. The delay cell according to claim 13, wherein the first, the second, the third, and the fourth logic gates are logical NOR gates.

15. The delay cell according to claim 13, wherein the first, the second, the third, and the fourth logic gates are logical NAND gates.

16. The delay line circuit comprising:

a plurality of selection lines, each selection line receiving a respective one of a plurality of external selection signals; and a plurality of delay cells connected in series, wherein each of the delay cells comprises:

a first logic gate generating a first signal based on an input signal and an external selection signal received from a respective one of the selection lines;

a second logic gate generating a second signal based on the input signal and the external selection signal;

a third logic gate generating a third signal based on a return signal and an output signal from the second logic gate; and a fourth logic gate inverting the output signal from the third logic gate in response to an enable signal, wherein the first, the second, the third, and the fourth logic gates are logical NOR gates, the first logic gate inverts and transmits the input signal to a pass terminal, and the third logic gate inverts and transmits the return signal to an output terminal when the selection signal is at a first logic level, the second logic gate inverts and transmits the input signal to the third logic gate, and the third logic gate inverts and transmits the output signal of the second logic gate to the output terminal when the selection signal is at a second logic level.

17. The delay line circuit according to claim 16, wherein the first logic gate NORs the selection signal and the input signal, the second logic gate NORs an inverted selection signal and the input signal, the third logic gate NORs the output signal of the second logic gate and the return signal, and the fourth logic gate NORs the enable signal and the output signal of the third logic gate.

* * * * *